US00RE47025E

(19) United States
(12) Reissued Patent
Dry

(10) Patent Number: US RE47,025 E
(45) **Date of Reissued Patent: *Sep. 4, 2018**

(54) LIGHT EMITTING DIODE LIGHT SOURCE

(71) Applicant: OptoLum, Inc., Tempe, AZ (US)

(72) Inventor: Joel M. Dry, Phoenix, AZ (US)

(73) Assignee: OptoLum, Inc., Tempe, AZ (US)

( * ) Notice: This patent is subject to a terminal disclaimer.

(21) Appl. No.: 15/423,898

(22) Filed: Feb. 3, 2017

Related U.S. Patent Documents

Reissue of:
(64) Patent No.: 6,573,536
Issued: Jun. 3, 2003
Appl. No.: 10/156,810
Filed: May 29, 2002

(51) Int. Cl.

| | |
|---|---|
| ***F21V 29/02*** | (2006.01) |
| ***F21V 29/00*** | (2015.01) |
| ***F21S 4/00*** | (2016.01) |
| ***F21V 19/00*** | (2006.01) |
| ***F21V 29/74*** | (2015.01) |
| ***F21V 29/54*** | (2015.01) |
| ***F21S 4/28*** | (2016.01) |
| ***F21V 29/83*** | (2015.01) |
| ***F21V 29/75*** | (2015.01) |
| ***F21K 9/20*** | (2016.01) |
| ***F21S 4/22*** | (2016.01) |
| *F21Y 115/10* | (2016.01) |

(Continued)

(52) U.S. Cl.
CPC ..... *F21V 29/00* (2013.01); *F21K 9/20* (2016.08); *F21S 4/22* (2016.01); *F21S 4/28* (2016.01); *F21V 29/54* (2015.01); *F21V 29/74* (2015.01); *F21V 29/75* (2015.01); *F21V 29/83* (2015.01); *F21V 19/001* (2013.01); *F21Y 2103/10* (2016.08); *F21Y 2107/30* (2016.08); *F21Y 2115/10* (2016.08)

(58) Field of Classification Search
CPC ..... F21V 29/00
See application file for complete search history.

(56) References Cited

U.S. PATENT DOCUMENTS 3,723,833 A 3/1973 Wheatley, Jr.
4,296,539 A 10/1981 Asami
(Continued)

FOREIGN PATENT DOCUMENTS

GB 2366610 A 3/2002
JP H11260119 A 9/1999
(Continued)

OTHER PUBLICATIONS

Petition for Inter Partes Review of U.S. Pat. No. 6,831,303 (Case No. IPR2017-01260), filed Apr. 11, 2017, pp. 1-65.
(Continued)

*Primary Examiner* — Deandra Hughes
(74) *Attorney, Agent, or Firm* — McCarter & English, LLP; Anita M. Bowles

(57) ABSTRACT

A light source that utilizes light emitting diodes that emit white light is disclosed. The diodes are mounted on an elongate member having at least two surfaces upon which the light emitting diodes are mounted. The elongate member is thermally conductive and is utilized to cool the light emitting diodes. In the illustrative embodiment, the elongate member is a tubular member through which a heat transfer medium flows.

51 Claims, 3 Drawing Sheets

(51) Int. Cl.
*F21Y 107/30* (2016.01)
*F21Y 103/10* (2016.01)

(56) References Cited

U.S. PATENT DOCUMENTS

| | | | | |
|---|---|---|---|---|
| 4,729,076 | A * | 3/1988 | Masami | B61L 5/1854 165/104.33 |
| 5,038,255 | A | 8/1991 | Nishihashi et al. | |
| 5,327,329 | A | 7/1994 | Stiles | |
| 5,660,461 | A | 8/1997 | Ignatius et al. | |
| 5,688,042 | A | 11/1997 | Madadi et al. | |
| 5,751,327 | A | 5/1998 | De Cock et al. | |
| 5,852,339 | A | 12/1998 | Hamilton et al. | |
| 5,861,703 | A | 1/1999 | Losinski | |
| 5,890,794 | A * | 4/1999 | Abtahi | B60Q 7/00 362/183 |
| 5,949,347 | A * | 9/1999 | Wu | G08B 7/062 313/318.04 |
| 6,077,327 | A | 6/2000 | Hamayoshi et al. | |
| 6,152,491 | A | 11/2000 | Queentry | |
| 6,220,722 | B1 | 4/2001 | Begemann | |
| 6,274,924 | B1 | 8/2001 | Carey et al. | |
| 6,293,753 | B1 | 9/2001 | Pal et al. | |
| 6,331,111 | B1 | 12/2001 | Cao | |
| 6,367,949 | B1 | 4/2002 | Pederson | |
| 6,411,046 | B1 | 6/2002 | Muthu | |
| 6,425,678 | B1 | 7/2002 | Verdes et al. | |
| 6,428,189 | B1 * | 8/2002 | Hochstein | 362/373 |
| 6,462,669 | B1 * | 10/2002 | Pederson | 340/815.45 |
| 6,465,961 | B1 | 10/2002 | Cao | |
| 6,472,823 | B2 * | 10/2002 | Yen | 315/112 |
| 6,490,159 | B1 | 12/2002 | Goenka et al. | |
| 6,492,725 | B1 | 12/2002 | Loh et al. | |
| 6,517,218 | B2 | 2/2003 | Hochstein | |
| 6,517,221 | B1 | 2/2003 | Xie | |
| 6,525,668 | B1 | 2/2003 | Petrick | |
| 6,561,690 | B2 | 5/2003 | Balestriero et al. | |
| 6,582,100 | B1 | 6/2003 | Hochstein et al. | |
| 6,611,110 | B1 | 8/2003 | Fregoso | |
| 6,682,211 | B2 * | 1/2004 | English | B60Q 1/2696 257/E25.028 |
| 6,692,251 | B1 | 2/2004 | Logan et al. | |
| 6,692,252 | B2 * | 2/2004 | Scott | A61C 19/004 433/29 |
| 6,707,073 | B1 | 3/2004 | Yamamoto et al. | |
| 6,712,486 | B1 | 3/2004 | Popovich et al. | |
| 6,715,900 | B2 | 4/2004 | Zhang | |
| 6,717,526 | B2 | 4/2004 | Martineau et al. | |
| 6,786,625 | B2 | 9/2004 | Wesson | |
| 6,799,864 | B2 | 10/2004 | Bohler et al. | |
| 6,815,724 | B2 * | 11/2004 | Dry | F21V 29/00 257/88 |
| 6,831,303 | B2 | 12/2004 | Dry | |
| 6,848,819 | B1 * | 2/2005 | Arndt | F21S 48/215 362/373 |
| 6,876,681 | B2 | 4/2005 | Nagamatsu | |
| 6,880,952 | B2 | 4/2005 | Kiraly et al. | |
| 7,242,028 | B2 | 7/2007 | Dry | |
| 7,288,796 | B2 | 10/2007 | Dry | |
| 7,645,056 | B1 * | 1/2010 | Mills | A61C 19/004 165/104.19 |
| 2001/0046652 | A1 * | 11/2001 | Ostler | A61C 19/004 433/29 |
| 2001/0049893 | A1 * | 12/2001 | Maas et al. | 40/544 |
| 2002/0005826 | A1 * | 1/2002 | Pederson | 345/82 |
| 2002/0056804 | A1 | 5/2002 | Konagaya | |
| 2002/0063223 | A1 * | 5/2002 | DeSteese | F28F 13/18 250/493.1 |
| 2002/0122134 | A1 | 9/2002 | Kalua | |
| 2002/0122309 | A1 * | 9/2002 | Abdelhafez | B64F 1/20 362/294 |
| 2002/0125839 | A1 | 9/2002 | Yen | |
| 2002/0149312 | A1 | 10/2002 | Roberts et al. | |
| 2002/0175597 | A1 | 11/2002 | Raman et al. | |
| 2002/0176250 | A1 | 11/2002 | Bohler et al. | |
| 2002/0191396 | A1 * | 12/2002 | Reiff et al. | F21V 13/12 362/236 |
| 2003/0040200 | A1 | 2/2003 | Cao | |
| 2003/0174517 | A1 | 9/2003 | Kiraly et al. | |
| 2005/0269581 | A1 | 12/2005 | Dry | |

FOREIGN PATENT DOCUMENTS

| | | | |
|---|---|---|---|
| JP | 2001243809 | A | 9/2001 |
| JP | 2002-093206 | A | 3/2002 |

OTHER PUBLICATIONS

Declaration of Jianzhong Jiao, Ph.D., Case No. IPR2017-01260 regarding U.S. Pat. No. 6,831,303 (Cree Ex. 1008), executed Apr. 10, 2017, pp. 1-100.

First Amended Complaint for Violations of the Lanham Act, Unjust Enrichment, and Patent Infringement, Case 2:16-cv-03828-DLR Document 32, filed Feb. 2, 2017 (Cree Ex. 1009 for Case No. IPR2017-01260), pp. 1-58.

Petition for Inter Partes Review of U.S. Pat. No. 7,242,028 (Case No. IPR2017-01261), filed Apr. 11, 2017, pp. 1-68.

Declaration of Jianzhong Jiao, Ph.D., Case No. IPR2017-01261 regarding U.S. Pat. No. 7,242,028 (Cree Ex. 1008 ), executed Apr. 10, 2017, pp. 1-114.

2002 Archive of Selected Headlines of Solid-State Lighting Headlines News downloaded from http://lighting.sandia.gov/Xlightingnewarchive2002.htm on Apr. 4, 2006.

American Heritage Dictionary of the English Language, 4th Ed., Copyright 2000, downloaded from http:///www.ask.com/reference/dictionary/ahdict/135632/carried on Jan. 24, 2006.

LT9512U 10 mm Cylinder Type LED, Sharp Corporation, publication date unknown, submitted in IDS for related U.S. Appl. No. 10/631,027, filed May 9, 2005.

ReviseWise Science, bbc.co.uk, downloaded from http://www.bbc.uk/apps/ifl/schools/gigaquiz?infile on Jan. 23, 2006, submitted in IDS for related U.S. Appl. No. 10/631,027, filed Jan. 26, 2006.

Thermal Conductivity Science, Hukseflux, downloaded from http:///www.huskeflux.com/thermal%20conductivity/thermal.htm on Jul. 22, 2005.

Ultrabright T-1¾ LED Lamps, Marktech Optoelectronics, publication date unknown, submitted in IDS for related U.S. Appl. No. 10/631,027, filed May 9, 2005.

Steigerwald, Daniel A. et al. "Illumination with Solid State Lighting Technology," IEEE Journal on Selected Topics in Quantum Electronics, vol. 8, No. 2 (Mar./Apr. 2002) pp. 310-320.

Petition for Inter Partes Review of U.S. Pat. No. 7,242,028 (Case No. IPR2017-01511), filed May 31, 2017, pp. 1-77.

Declaration of Jianzhong Jiao, Ph.D., Case No. IPR2017-01511 regarding U.S. Pat. No. 7,242,028 (Cree Ex. 1008 ), executed May 31, 2017, pp. 1-150.

Patent Owner's Preliminary Response Pursuant to 37 C.F.R. § 42.107. Case No. IPR2017-01261, U.S. Pat. No. 7,242,028. 63 pages. Jul. 27, 2017.

Exhibit 2001 to Patent Owner's Preliminary Response for IPR2017-01261—Declaration of Brent York, P. Eng., MBA. Case No. IPR2017-01261, U.S. Pat. No. 7,242,028. 64 pages. Jul. 27, 2017.

Exhibit 2002 to Patent Owner's Preliminary Response for IPR2017-01261—Brent York, Curriculum Vitae. 11 pages. Jul. 27, 2017.

Merriam-Webster, Polyhedron. https://www.merriam-webster.com/dictionary/polyhedron. Frustum. https://www.merriam-webster.com/dictionary.frustum. 5 pages. Retrieved Jun. 2017. (Exhibit 2003 to Patent Owner's Preliminary Response for IPR 2017-01261.)

Kordyban, Hot Air Rises and Heat Sinks: Everything You Know About Cooling Electronics Is Wrong. ASME Press, New York. pp. 39, 41, 42, 121, 122, 123, 124, 125, 126. Jul. 7, 1998. (Exhibit 2005 to Patent Owner's Preliminary Response for IPR 2017-01261.)

Lasance, C. J. M., "The Conceivable Accuracy of Experimental and Numerical Thermal Analyses of Electronic Systems." IEEE Trans-

(56) References Cited

OTHER PUBLICATIONS actions on Components and Packaging Technologies. Sep. 2002;25(3):366-382. (Exhibit 2006 to Patent Owner's Preliminary Response for IPR 2017-01261.)
Kikuchi et al., "An Approach to Predicting LED Junction Temperatures With Fluid and Thermal Analysis." SAE Paper No. 2005-01-0864. 9 pages. (2005). (Exhibit 2007 to Patent Owner's Preliminary Response for IPR 2017-01261.)
Exhibit 2008 to Patent Owner's Preliminary Response for IPR2017-01261—Thermal Analysis of the LED Lamp in U.S. Pat. No. 6,220,722 (Begemann). 77 pages. Jul. 2017.
Exhibit 2009 to Patent Owner's Preliminary Response for IPR2017-01261—Declaration of Michael K. Milani. Case No. IPR2017-01261, U.S. Pat. No. 7,242,028, 160 pages. Jul. 27, 2017.
Exhibit 2010 to Patent Owner's Preliminary Response for IPR2017-01261—Infringement Claim Chart of an Exemplary Cree LED Bulb in view of Claim 1 of U.S. Pat. No. 7,242,028 5 pages. Jul. 27, 2017.
U.S. Department of Energy, "L-Prize—Transforming the Lighting Landscape," 3 pages, Nov. 1, 2016. (Exhibit 2011 to Patent Owner's Preliminary Response for IPR 2017-01261.)
The Department of Energy—Office of Public Affairs, "Department of Energy Announces Philips Lighting North America as Winner of L Prize Competition," 12 pages, Aug. 3, 2011. (Exhibit 2012 to Patent Owner's Preliminary Response for IPR 2017-01261.)
Koninklijke Philips, "Bright Tomorrow Lighting Prize (L Prize)." http://www.philips.com/a-w/about/news/archive/standard/news/backgrounders/2011/20110803_backgrounder_l_prize.html. 3 pages. Aug. 3, 2011. (Exhibit 2013 to Patent Owner's Preliminary Response for IPR 2017-01261.)
Sandru, "This Earth Day, Philips Unveiled Lightbulb With 20-Year Lifespan," The Green Optimistic. https://www.greenoptimistic.com/philips-earth-day-light-bulb-20120423/#.WQtvdRP1BhE. 5 pages. Apr. 23, 2012. (Exhibit 2014 to Patent Owner's Prelliminary Response for IPR 2017-01261.)
Patent Owner's Preliminary Response Pursuant to 37 C.F.R. § 42.107. Case No. IPR2017-01260, U.S. Pat. No. 6,831,303. 64 pages. Jul. 27, 2017.
Exhibit 2001 to Patent Owner's Preliminary Response for IPR2017-01260—Declaration of Brent York, P. Eng., MBA. Case No. IPR2017-01260, U.S. Pat. No. 6,831,303. 63 pages. Jul. 27, 2017.
Exhibit 2009 to Patent Owner's Preliminary Response for IPR2017-01260—Declaration of Michael K. Milani. Case No. IPR2017-01260, U.S. Pat. No. 6,831,303. 160 pages. Jul. 27, 2017.
Exhibit 2010 to Patent Owner's Preliminary Response for IPR2017-01260—Infringement Claim Chart of an Exemplary Cree LED Bulb in view of Claim 1 of U.S. Pat. No. 6,831,303 6 pages. Jul. 27, 2017.
Patent Owner's Preliminary Response Pursuant to 37 C.F.R. § 42.107. Case No. IPR2017-01511, U.S. Pat. No. 7,242,028. 71 pages. Sep. 5, 2017.
Exhibit 2001 to Patent Owner's Preliminary Response for IPR2017-01511—Declaration of Brent York, P. Eng., MBA. Case No. IPR2017-01511, U.S. Pat. No. 7,242,028. 65 pages. Sep. 4, 2017.
Patent Trial and Appeal Board Order Denying Institution of Inter Partes Review of U.S. Pat. No. 6,831,303 (IPR2017-1260) dated Oct. 26, 2017 (25 pages).
Patent Trial and Appeal Board Order Denying Institution of Inter Partes Review of U.S. Pat. No. 7,242,028 (IPR2017-1261) dated Oct. 26, 2017 (26 pages).
Patent Trial and Appeal Board Order Denying Institution of Inter Partes Review of U.S. Pat. No. 7,242,028 (IPR2017-1511) dated Dec. 4, 2017 (26 pages).
Answer and Affirmative Defenses of Cree, Inc. to Plaintiff's First Amended Complaint for Violations of the Lanham Act, Unjust Enrichment, and Patent Infringement. *OptoLum, Inc.* v. *Cree, Inc.*, Civil Action No. 1:17-cv-00687, United States District Court for the Middle District of North Carolina. Aug. 7, 2017. 28 pages.
Memorandum of Cree, Inc. in Support of its Claim Construction. *OptoLum, Inc.* v. *Cree, Inc.*, Civil Action No. 1:17-cv-00687, United States District Court for the Middle District of North Carolina, Dec. 18, 2017. 30 pages.
U.S. Appl. No. 10/984,366, (Exhibit C for Memorandum of Cree, Inc. in Support of its Claim Construction dated Dec. 18, 2017 filed in *OptoLum, Inc.* v. *Cree, Inc.*, Case 1:17-cv-00687-WO-JLW, United States District Court for the Middle District of North Carolina.)
Non-Final Office Action for U.S. Appl. No. 10/984,366, dated Apr. 5, 2006, 24 pages. (Exhibit D for Memorandum of Cree, Inc. in Support of its Claim Construction dated Dec. 18, 2017 filed in *OptoLum, Inc.* v. *Cree, Inc.*, Case 1:17-cv-00687-WO-JLW, United States District Court for the Middle District of North Carolina.)
Amendment/Response to Non-Final Office Action for U.S. Appl. No. 10/984,366, dated Aug. 19, 2006, 38 pages. (Exhibit E for Memorandum of Cree, Inc. in Support of its Claim Construction dated Dec. 18, 2017 filed in *OptoLum, Inc.* v. *Cree, Inc.*, Case 1:17-cv-00687-WO-JLW, United States District Court for the Middle District of North Carolina.)
Transcript of Videotaped Deposition of A. Brent York, *OptoLum, Inc.* v. *Cree, Inc.*, C.A. No. 1:17-cv-00687, United States District Court for the Middle District of North Carolina, Dec. 1, 2017. 202 pages. (Exhibit F for Memorandum of Cree, Inc. in Support of its Claim Construction, dated Dec. 18, 2017.)
Transcript of Oral Deposition of Dr. Eric Bretschneider. *OptoLum, Inc.* v. *Cree, Inc.*, Civil Action No. 1:17-cv-00687, United States District Court for the Middle District of North Carolina, Nov. 29, 2017. 212 pages. (Exhibit G for Memorandum of Cree, Inc. in Support of its Claim Construction, dated Dec. 18, 2017.)
Prosecution history of U.S. Appl. No. 10/156,810 entitled "Light Emitting Diode Light Source" (issued as U.S. Pat. No. 6,573,536 on Jun. 3, 2003). 59 pages. (Exhibit H for Memorandum of Cree, Inc. in Support of its Claim Construction dated Dec. 18, 2017 filed in *OptoLum, Inc.* v. *Cree, Inc.*, Case 1:17-cv-00687-WO-JLW, United States District Court for the Middle District of North Carolina.)
OptoLum's Opening Memorandum in Support of Claim Construction Pursuant to L.R. 104.5. *OptoLum, Inc.* v. *Cree, Inc.*, Civil Action No. 1:17-cv-0687-WO-JLW, United States District Court for the Middle District of North Carolina, Dec. 18, 2017. 33 pages.
Expert Declaration of A. Brent York on Claim Construction. *OptoLum, Inc.* v. *Cree, Inc.*, Civil Action No. 1:17-cv-00687, United States District Court for the Middle District of North Carolina, Dec. 18, 2017. 35 pages. (Exhibit 3 for OptoLum's Opening Memorandum in Support of Claim Construction Pursuant to L.R. 104.5.)
Non-Final Office Action issued for U.S. Appl. No. 10/430,696, dated Jan. 10, 2008. 13 pages. (Exhibit 4 for OptoLum's Opening Memorandum in Support of Claim Construction filed Dec. 18, 2017 in *OptoLum, Inc.* v. *Cree, Inc.*, Case 1:17-cv-00687-WO-JLW, United States District Court for the Middle District of North Carolina.)
Amendment/Response to Non-Final Office Action for U.S. Appl. No. 10/984,366, dated Aug. 19, 2006. 39 pages. (Exhibit 6 for OptoLum's Opening Memorandum in Support of Claim Construction filed Dec. 18, 2017 in *OptoLum, Inc.* v. *Cree, Inc.*, Case 1:17-cv-00687-WO-JLW, United States District Court for the Middle District of North Carolina.)
Final Office Action for U.S. Appl. No. 10/984,366, dated Nov. 1, 2006. 26 pages. (Exhibit 7 for OptoLum's Opening Memorandum in Support of Claim Construction filed Dec. 18, 2017 in *OptoLum, Inc.* v. *Cree, Inc.*, Case 1:17-cv-00687-WO-JLW, United States District Court for the Middle District of North Carolina.)
Webster's Third New International Dictionary of the English Language, Unabridged. Merriam-Webster Inc., Springfield, Massachusetts. Philip Babcock Gove (Ed.), (1986), pp. 1598 and 2171. (Exhibit 8 for OptoLum's Opening Memorandum in Support of Claim Construction filed Dec. 18, 2017 in *OptoLum, Inc.*v. *Cree, Inc.*, Case 1:17-cv-00687-WO-JLW, United States District Court for the Middle District of North Carolina.)
Non-Final Office Action for U.S. Appl. No. 10/984,366, dated Apr. 5, 2006. 24 pages. (Exhibit 9 for OptoLum's Opening Memorandum in Support of Claim Construction filed Dec. 18, 2017 in *OptoLum, Inc.* v. *Cree, Inc.*, Case 1:17-cv-00687-WO-JLW, United States District Court for the Middle District of North Carolina.)
Non-Final Office Action for U.S. Appl. No. 10/631,027, dated Jul. 2, 2004. 17 pages. (Exhibit 10 for OptoLum's Opening Memorandum in Support of Claim Construction filed Dec. 18, 2017 in

(56) References Cited

OTHER PUBLICATIONS

*OptoLum, Inc.* v. *Cree, Inc.*, Case 1:17-cv-00687-WO-JLW, United States District Court for the Middle District of North Carolina.)
Patent Trial and Appeal Board Decision Denying Institution of Inter Partes Review of U.S. Pat. No. 7,242,028, IPR2017-01511, dated Dec. 4, 2017, pp. 14-16. (Exhibit 11 for OptoLum's Opening Memorandum in Support of Claim Construction filed Dec. 18, 2017 in *OptoLum, Inc.* v. *Cree, Inc.*, Case 1:17-cv-00687-WO-JLW, United States District Court for the Middle District of North Carolina.)
OptoLum's Response to Cree's Claim Construction Brief. *OptoLum, Inc.* v. *Cree, Inc.*, Civil Action No. 17-cv-0687-WO-JLW, United States District Court for the Middle District of North Carolina, dated Jan. 8, 2018. 36 pages.
Supplemental Expert Declaration of A. Brent York on Claim Construction. *Optolum, Inc.* v. *Cree, Inc.*, Civil Action No. 1:17-cv-00687. United States District Court for the Middle District of North Carolina, Jan. 8, 2018. 14 pages. (Exhibit 12 to Optolum's Response to Cree's Claim Construction Brief.)
Transcript of Videotaped Deposition of A. Brent York. *OptoLum, Inc.* v. *Cree, Inc.*, C.A. No. 1:17-cv-00687, United States District Court for the Middle District of North Carolina, taken Dec. 1, 2017, pp. 74-77. (Exhibit 13 for OptoLum's Response to Cree's Claim Construction Brief.)
Transcript of Oral Deposition of Dr. Eric Bretschneider. *OptoLum, Inc.* v. *Cree, Inc.*, Civil Action No. 1:17-cv-00687. United States District Court for the Middle District of North Carolina, taken Nov. 29, 2017, pp. 1-4, 133-140, and 185-204. (Exhibit 14 for OptoLum's Response to Cree's Claim Construction Brief.)
Perry et al., "Natural Convection," in Perry's Chemical Engineers' Handbook, Sixth Edition. McGraw-Hill, Inc., Robert H. Perry (Ed.), pp. 10-13 (1984). (Exhibit 15 for OptoLum's Response to Cree's Claim Construction Brief. *OptoLum, Inc.* v. *Cree, Inc.*, Civil Action No. 17-cv-0687-WO-JLW, United States District Court for the Middle District of North Carolina, dated Jan. 8, 2018.)
Opposition Memorandum of Cree, Inc. in Support of its Claim Construction. *OptoLum, Inc.* v. *Cree, Inc.*, Civil Action No. 1:17-cv-00687, United States District Court for the Middle District of North Carolina, Jan. 8, 2018. 29 pages.
Transcript of Markman Hearing Before the Honorable William L. Osteen, Jr. United States District Judge. *OptoLum, Inc.* vs. *Cree, Inc.*, Case No. 1:17CV687, United States District Court for the Middle District of North Carolina, held Jan. 16, 2018. 129 pages.
Cree Inc.'s Motion for Summary Judgment for Invalidity of U.S. Pat. No. 7,242,038 under 35 U.S.C. §101, or in the Alternative, 35 U.S.C. §112. *OptoLum, Inc.* v. *Cree, Inc.*, Civil Action No. 17-cv-0687-WO-JLW, United States District Court for the Middle District of North Carolina, dated Dec. 28, 2017. 5 pages.
Memorandum in Support of Cree Inc.'s Motion for Summary Judgment for Invalidity of U.S. Pat. No. 7,242,038 under 35 U.S.C. §101, or in the Alternative, 35 U.S.C. §112. *OptoLum, Inc.* v. *Cree, Inc.*, Civil Action No. 17-cv-0687-WO-JLW, United States District Court for the Middle District of North Carolina, dated Dec. 28, 2017. 33 pages.
Supplemented Declaration of Dr. Eric Bretschneider Regarding Claim Construction in Support of Cree, Inc. *OptoLum, Inc.* v. *Cree, Inc.*, Civil Action No. 1:17-cv-00687, United States District Court for the Middle District of North Carolina, dated Dec. 18, 2017. 102 pages. (Exhibit C for Memorandum in Support of Cree Inc.'s Motion for Summary Judgment for Invalidity of U.S. Pat. No. 7,242,038 under 35 U.S.C. §101, or in the Alternative, 35 U.S.C. §112, dated Dec. 28, 2017).
OptoLum, Inc.'s Rule 3-1 Disclosure of Asserted Claims and Infringement Contentions. *OptoLum, Inc.* v. *Cree, Inc.*, No. CV16-03828-PHX-DLR, United States District Court for the District of Arizona Phoenix Division, dated Apr. 21, 2017. 11 pages. (Exhibit D for Memorandum in Support of Cree Inc.'s Motion for Summary Judgment for Invalidity of U.S. Pat. No. 7,242,038 under 35 U.S.C. §101, or in the Alternative, 35 U.S.C. §112, filed Dec. 29, 2017 in *OptoLum, Inc.* v. *Cree, Inc.*, Civil Action No. 17-cv-0687-WO-JLW, United States District Court for the Middle District of North Carolina.
Letter from Keith Toms to Lynne Borchers and Peter Siddoway dated Nov. 3, 2017 regarding *OptoLum* v. *Cree*, 17-cv-00687. 2 pages. (Exhibit E for Memorandum in Support of Cree Inc.'s Motion for Summary Judgment for Invalidity of U.S. Pat. No. 7,242,038 under 35 U.S.C. §101, or in the Alternative, 35 U.S.C. §112, filed Dec. 29, 2017 in *OptoLum, Inc.* v. *Cree, Inc.*, Civil Action No. 17-cv-0687-WO-JLW, United States District Court for the Middle District of North Carolina.)
Final Office Action for U.S. Appl. No. 10/984,366, dated Nov. 1, 2006. 27 pages. (Exhibit F for Memorandum in Support of Cree Inc.'s Motion for Summary Judgment for Invalidity of U.S. Pat. No. 7,242,038 under 35 U.S.C. §101, or in the Alternative, 35 U.S.C. §112, filed Dec. 29, 2017 in *OptoLum, Inc.* v. *Cree, Inc.*, Civil Action No. 17-cv-0687-WO-JLW, United States District Court for the Middle District of North Carolina.)
Amendment After Final Rejection for U.S. Appl. No. 10/984,366, dated Feb. 1, 2007. 14 pages. (Exhibit G for Memorandum in Support of Cree Inc.'s Motion for Summary Judgment for Invalidity of U.S. Pat. No. 7,242,038 under 35 U.S.C. §101, or in the Alternative, 35 U.S.C. §112, filed Dec. 29, 2017 in *OptoLum, Inc.* v. *Cree, Inc.*, Civil Action No. 17-cv-0687-WO-JLW, United States District Court for the Middle District of North Carolina.)
Terminal Disclaimer to Obviate a Double Patenting Rejection Over a "Prior" Patent filed in U.S. Appl. No. 10/984,366 and signed on Feb. 1, 2007. 2 pages. (Exhibit H for Memorandum in Support of Cree Inc.'s Motion for Summary Judgment for Invalidity of U.S. Pat. No. 7,242,038 under 35 U.S.C. §101, or in the Alternative, 35 U.S.C. §112, filed Dec. 29, 2017 in *OptoLum, Inc.* v. *Cree, Inc.*, Civil Action No. 17-cv-0687-WO-JLW, United States District Court for the Middle District of North Carolina.)
Opposition of OptoLum, Inc. to Cree, Inc.'s Motion for Summary Judgment for Invalidity of U.S. Pat. No. 7,242,038 under 35 U.S.C. §101, or in the Alternative, 35 U.S.C. §112. *Optolum, Inc.* v. *Cree, Inc.*, Civil Action No. 17-cv-0687-WO-JLW, United States District Court for the Middle District of North Carolina, dated Feb. 5, 2018. 31 pages.
Cree, Inc.'s Third Supplemental Rule 3-3 Invalidity Contentions and Disclosures. *OptoLum, Inc.* v. *Cree, Inc.*, Civil Action No. 1:17-cv-00687. United States District Court for the Middle District of North Carolina dated Nov. 22, 2017. 33 pages. (Exhibit A for Opposition of OptoLum, Inc. to Cree, Inc.'s Motion for Summary Judgment for Invalidity of U.S. Pat. No. 7,242,038 under 35 U.S.C. §101, or in the Alternative, 35 U.S.C. §112, dated Feb. 5, 2018).
Transcript of Videotaped Deposition of A. Brent York, Dec. 1, 2017. *OptoLum, Inc.* vs. *Cree, Inc.*, C.A. No. 1:17-cv-00687, United States District Court for the Middle District of North Carolina, 77 pages. (Exhibit B for Opposition of OptoLum, Inc. to Cree, Inc.'s Motion for Summary Judgment for Invalidity of U.S. Pat. No. 7,242,038 under 35 U.S.C. §101, or in the Alternative, 35 U.S.C. §112, dated Feb. 5, 2018.)
Non-Final Office Action for U.S. Appl. No. 10/984,366, dated Apr. 5, 2006. 53 pages. (Exhibit C for Opposition of OptoLum, Inc. to Cree, Inc.'s Motion for Summary Judgment for Invalidity of U.S. Pat. No. 7,242,038 under 35 U.S.C. §101, or in the Alternative, 35 U.S.C. §112. *OptoLum, Inc.* v. *Cree, Inc.*, Civil Action No. 17-cv-0687-WO-JLW, United States District Court for the Middle District of North Carolina, dated Feb. 5, 2018.)
Transcript of Oral Deposition of Dr. Eric Bretschneider. *Optolum, Inc.* vs. *Cree, Inc.*, Civil Action No. 1:17-cv-00687, United States District Court for the Middle District of North Carolina, date Nov. 29, 2017. (Exhibit D for Opposition of OptoLum, Inc. to Cree, Inc.'s Motion for Summary Judgment for Invalidity of U.S. Pat. No. 7,242,038 under 35 U.S.C. §101, or in the Alternative, 35 U.S.C. §112, dated Feb. 5, 2018.)
Proposed Surreply of OptoLum, Inc. In Opposition to Cree, Inc.'s Motion for Summary Judgment for Invalidity of U.S. Pat. No. 7,242,038 under 35 U.S.C. §101, or in the Alternative, 35 U.S.C. §112. *OptoLum, Inc.* v. *Cree, Inc.*, Civil Action No. 17-cv-0687-

(56) References Cited

OTHER PUBLICATIONS

WO-JLW, United States District Court for the Middle District of North Carolina, dated Mar. 12, 2018. 13 pages.

* cited by examiner 100
101
107
109
105
111

103

100
101
123
121

100
102
124
123
122
121
111

131
104
105
113
137
129
107

LIGHT EMITTING DIODE LIGHT SOURCE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*RELATED APPLICATIONS*

*More than one reissue application has been filed for the reissue of U.S. Pat. No. 6,573,536. The reissue applications are application Ser. No. 15/423,898 filed Feb. 3, 2017, which is the present application, and application Ser. No. 15/424,517 filed Feb. 3, 2017, which is a continuation reissue of the present application.*

*This application is a reissue application of U.S. Pat. No. 6,573,536, which issued on Jun. 3, 2003.*

FIELD OF THE INVENTION

This invention pertains to lighting sources, in general, and to a lighting source that utilizes Light Emitting Diodes (LED's), in particular.

BACKGROUND OF THE INVENTION

LED's have many advantages as light sources. However, in the past LED's have found application only as specialized light sources such as for vehicle brake lights, and other vehicle related lighting, and recently as flashlights. In these prior applications, the LED's are typically mounted in a planar fashion in a single plane that is disposed so as to be perpendicular to the viewing area. Typically the LED planar array is not used to provide illumination, but to provide signaling.

Recent attempts to provide LED light sources as sources of illumination have been few, and generally unsatisfactory from a general lighting standpoint.

It is highly desirable to provide a light source utilizing LED's that provides sufficient light output so as to be used as a general lighting source rather than as a signaling source.

One problem that has limited the use of LED's to specialty signaling and limited general illumination sources is that LED's typically generate significant amounts of heat. The heat is such that unless the heat is dissipated, the LED internal temperature will rise causing degradation or destruction of the LED.

It is therefore further desirable to provide an LED light source that efficiently conducts heat away from the LED's.

SUMMARY OF THE INVENTION

In accordance with the principles of the invention, an improved light source is provided. The light source includes an elongate thermally conductive member having an outer surface. A plurality of light emitting diodes is carried on the elongate member outer surface. At least some of the light emitting diodes are disposed in a first plane and others of said light emitting diodes are disposed in a second plane not coextensive with the first plane. Electrical conductors are carried by the elongate thermally conductive member and are connected to the plurality of light emitting diodes to supply electrical power thereto. The elongate thermally conductive member conducts heat away from the light emitting diodes.

In accordance with one aspect of the invention, an illustrative embodiment of the invention utilizes light emitting diodes that emit white light. However, other embodiments of the invention may utilize light emitting diodes that are of different colors to produce monochromatic light or the colors may be chosen to produce white light or other colors.

In accordance with another aspect of the invention the elongate thermally conductive member transfers heat from the light emitting diodes to a medium within said elongate thermally conductive member. In the illustrative embodiment of the invention, the medium is air.

In accordance with another aspect of the invention, the elongate thermally conductive member has one or more fins to enhance heat transfer to the medium.

In accordance with another aspect of the invention the elongate thermally conductive member comprises a tube. In one embodiment of the invention, the tube has a cross-section in the shape of a polygon. In another embodiment of the invention, the tube has a cross-section having flat portions.

In accordance with another embodiment of the invention, the elongate thermally conductive member comprises a channel.

In accordance with the principles of the invention, the elongate thermally conductive member may comprise an extrusion, and the extrusion can be highly thermally conductive material such as aluminum.

In one preferred embodiment of the invention the elongate thermally conductive member is a tubular member. The tubular member has a polygon cross-section. However, other embodiments my have a tubular member of triangular cross-section.

In one embodiment of the invention, a flexible circuit is carried on a surface of said elongate thermally conductive member; the flexible circuit includes the electrical conductors.

In another aspect of the invention, the flexible circuit comprises a plurality of apertures for receiving said plurality of light emitting diodes. Each of the light emitting diodes is disposed in a corresponding one of the apertures and affixed in thermally conductive contact with said elongate thermally conductive member.

The elongate thermally conductive member includes a thermal transfer media disposed therein in a flow channel.

At least one clip for mounting the elongate thermally conductive member in a fixture may be included.

BRIEF DESCRIPTION OF THE DRAWING

The invention will be better understood from a reading of the following detailed description of a preferred embodiment of the invention taken in conjunction with the drawing figures, in which like reference indications identify like elements, and in which.

DETAILED DESCRIPTION

Figures 1, 2, 3:
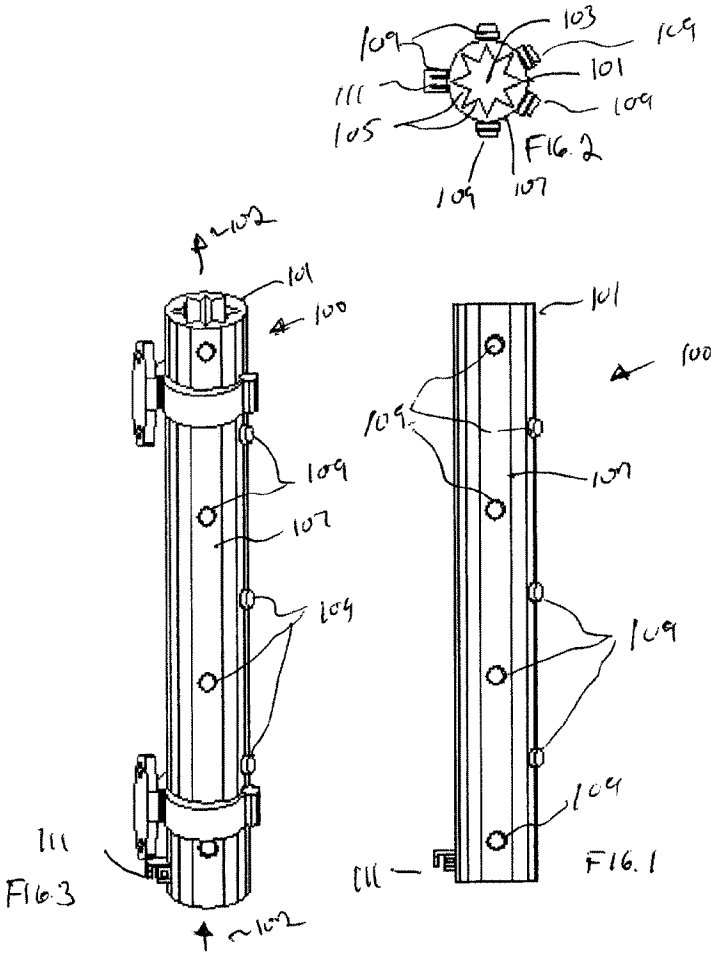
FIG. 1 is a planar side view of a light source in accordance with the principles of the invention.
FIG. 2 is a top planar view of the light source of FIG. 1.
FIG. 3 is a perspective view of the light source of FIG. 1 with mounting clips.

A light source in accordance with the principles of the invention may be used as a decorative lighting element or may be utilized as a general illumination device. As shown in FIG. 1, a light source 100 in accordance with the invention includes an elongate thermally conductive member or heat sink 101. Elongate heat sink 101 is formed of a material that provides excellent thermal conductivity. Elongate heat sink 101 in the illustrative embodiment of the invention is a tubular aluminum extrusion. To improve the heat dissipative properties of light source 100, elongate heat sink 101 is configured to provide convective heat dissipation and cooling. As more clearly seen in FIG. 2, tubular heat sink 101 is hollow and has an interior cavity 103 that includes one or more heat dissipating fins 105. Fins 105 are shown as being triangular in shape, but may take on other shapes. Fins 105 are integrally formed on the interior of elongate heat sink 101. In the illustrative embodiment convective cooling is provided by movement of a medium 102 through elongate heat sink 101. The medium utilized in the illustrative embodiment is air, but may in some applications be a fluid other than air to provide for greater heat dissipation and cooling.

The exterior surface 107 of elongate heat sink 101 has a plurality of Light Emitting Diodes 109 disposed thereon. Each LED 109 in the illustrative embodiment comprises a white light emitting LED of a type that provides a high light output. Each LED 109 also generates significant amount of heat that must be dissipated to avoid thermal destruction of the LED. By combining a plurality of LEDs 109 on elongate heat sink 101, a high light output light source that may be used for general lighting is provided.

Conductive paths 129 are provided to connect LEDs 109 to an electrical connector 111. The conductive paths may be disposed on an electrically insulating layer 131 or layers disposed on exterior surface 107. In the illustrative embodiment shown in the drawing figures, the conductive paths and insulating layer are provided by means of one or more flexible printed circuits 113 that are permanently disposed on surface 107. As more easily seen in FIG. 6, printed circuit 113 includes an electrically insulating layer 131 that carries conductive paths 129. As will be appreciated by those skilled in the art, other means of providing the electrically conductive paths on the Flexible printed circuit 113 has LED's 109 mounted to it in a variety of orientations ranging from 360 degrees to 180 degrees and possibly others depending on the application. Electrical connector 111 is disposed at one end of printed circuit 113. Connector 113 is coupleable to a separate power supply to receive electrical current. Flexible printed circuit 113, in the illustrative embodiment is coated with a non-electrically conductive epoxy that may be infused with optically reflective materials. Flexible printed circuit 113 is adhered to the tube 101 with a heat conducting epoxy to aid in the transmission of the heat from LEDs 109 to tube 101. Flexible printed circuit 113 has mounting holes 134 for receiving LEDs 109 such that the backs of LEDs 109 are in thermal contact with the tube surface 107.

Figure 7:
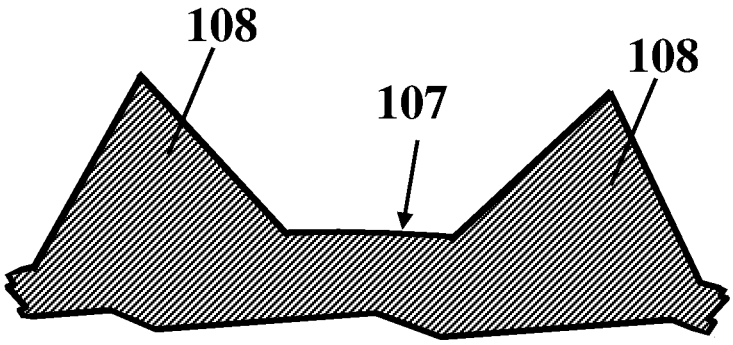
*FIG. 7 is a cross-sectional view of a portion of an elongate heat sink with fins on an outer surface of the heat sink in accordance with some embodiments.*

Tubular heat sink 101 in the illustrative embodiment is formed in the shape of a polygon and may have any number of sides. Although tubular heat sink 101 in the illustrative embodiment is extruded aluminum, tubular heat sink 101 may comprise other thermal conductive material. Fins 105 may vary in number and location depending on particular LED layouts and wattage. In some instances, fins *108* may be added to the exterior surface of tubular heat sink 101 (*see, e.g., FIG. 7*). In addition, apertures may be added to the tubular heat sink to enhance heat flow.

Figures 4, 5, 6:
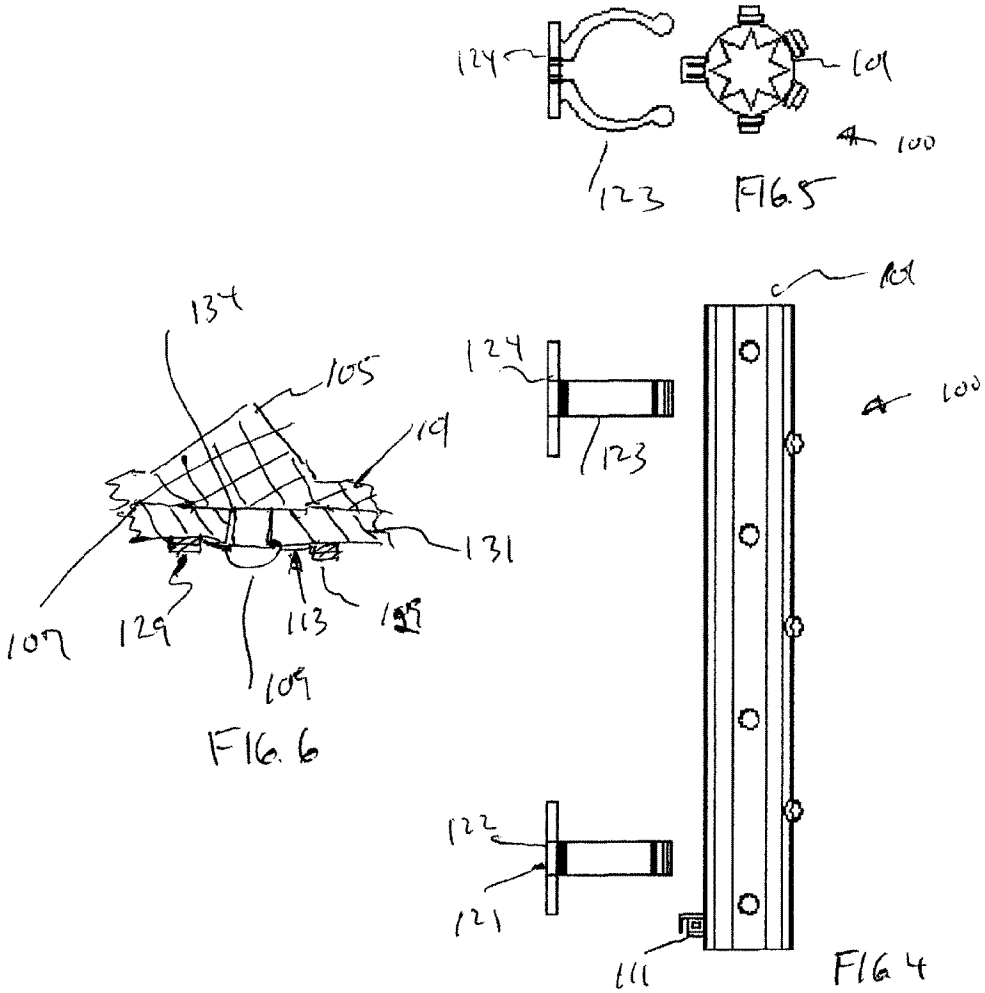
FIG. 4 is a planar side view of the light source of FIG. 3 showing mounting clips separated from the light source.
FIG. 5 is a top view of the light source and mounting clips of FIG. 4.
FIG. 6 is a partial cross-section of the light source of FIG. 1.

Light source 100 is mounted into a fixture and retained in position by mounting clips 121, 123 as most clearly seen in FIGS. 3, 4, and 5. Each of the clips is shaped so as to engage and retain light source 100. Each clip is affixed on one surface 122, 124 to a light fixture.

Although light source 100 is shown as comprising an elongate tubular heat sink, other extruded elongate members may be used such as channels.

In the illustrative embodiment shown, convection cooling by flow of air through tubular heat sink 101 is utilized such that cool or unheated air enters tubular heat sink 101 at its lower end and exits from the upper end as heated air. In higher wattage light sources, rather than utilizing air as the cooling medium, other fluids may be utilized. In particular, convective heat pumping may be used to remove heat from the interior of the heat sink.

In one particularly advantageous embodiment of the invention, the light source of the invention is configured to replace compact fluorescent lighting in decorative applications.

As will be appreciated by those skilled in the art, the principles of the invention are not limited to the use of light emitting diodes that emit white light. Different colored light emitting diodes may be used to produce monochromatic light or to produce light that is the combination of different colors.

Although the invention has been described in terms of illustrative embodiments, it is not intended that the invention be limited to the illustrative embodiments shown and described. It will be apparent to those skilled in the art that various changes and modifications may be made to the embodiments shown and described without departing from the spirit or scope of the invention. It is intended that the invention be limited only by the claims appended hereto.

What is claimed is:

1. A light source comprising:

an elongate thermally conductive member having an outer surface*, a first end, and a second end*;

[at least one] *a plurality of* light emitting diodes carried on said elongate member outer surface;

one or more electrical conductors carried by said elongate thermally conductive member and connected to said [at least one] *plurality of* light emitting diodes to supply electrical power thereto; [and]

said elongate thermally conductive member being configured to conduct heat away from said [at least one light emitting diode] *plurality of light emitting diodes* to fluid contained by said elongate thermally conductive member*;*

*wherein a back of each of said plurality of light emitting diodes is in thermal contact with a corresponding underlying portion of said elongate member outer surface;*

*wherein said elongate thermally conductive member comprises:*

*at least one opening at the first end that facilitates entry of fluid into said elongate thermally conductive member; and*

*at least one opening at the second end that facilitates convective movement of heated fluid out of said elongate thermally conductive member; and*

*a plurality of exterior fins added to said elongate member outer surface to conduct heat to fluid surrounding said plurality of exterior fins thereby facilitating convective heat dissipation.*

2. A light source comprising:

an elongate thermally conductive member having an outer surface*, a first end, and a second end*;

a plurality of light emitting diodes carried on said elongate member outer surface*,* at least some of said light emitting diodes being disposed in a first plane and others of said light emitting diodes being disposed in a second plane not coextensive with said first plane;

electrical conductors carried by said elongate thermally conductive member and connected to said plurality of light emitting diodes to supply electrical power thereto; [and]

said elongate thermally conductive member being configured to conduct heat away from said *plurality of* light emitting diodes to fluid contained by said elongate thermally conductive member*;*

*wherein a back of each of said plurality of light emitting diodes is in thermal contact with a corresponding underlying portion of said elongate member outer surface;*

*wherein said elongate thermally conductive member comprises:*

*at least one opening at the first end that facilitates entry of fluid into said elongate thermally conductive member; and*

*at least one opening at the second end that facilitates convective movement of heated fluid out of said elongate thermally conductive member; and*

*a plurality of exterior fins added to said elongate member outer surface to conduct heat to fluid surrounding said plurality of exterior fins thereby facilitating convective heat dissipation.*

3. A light source in accordance with claim 2, wherein: each of said *plurality of* light emitting diodes emits white light.

4. A light source in accordance with claim 2, wherein: said fluid comprises air.

[5. A light source in accordance with claim 4, wherein: said elongate thermally conductive member comprises one or more heat dissipation protrusions.]

6. A light source in accordance with claim 2, wherein: said elongate thermally conductive member comprises a tube.

7. A light source in accordance with claim 6, wherein: said tube has a cross-section in the shape of a polygon.

8. A light source in accordance with claim 6, wherein: said tube has a cross-section having flat portions.

9. A light source in accordance with claim 2, wherein: said elongate thermally conductive member comprises a channel.

10. A light source in accordance with claim 2, wherein: said elongate thermally conductive member comprises an extrusion.

11. A light source in accordance with claim 10, wherein: said extrusion is an aluminum extrusion.

12. A light source in accordance with claim 11, wherein: said elongate thermally conductive member is a tubular member.

13. A light source in accordance with claim 12, wherein: said tubular member has a polygon cross-section.

14. A light source in accordance with claim 12, wherein: said tubular member has a triangular cross-section.

15. A light source in accordance with claim 2, *further* comprising: a flexible circuit carried on a surface of said elongate thermally conductive member, said flexible circuit comprising said electrical conductors.

16. A light source in accordance with claim 15, wherein: said flexible circuit comprises a plurality of apertures for receiving said plurality of light emitting diodes.

17. A light source in accordance with claim 16, wherein: each of said light emitting diodes is disposed in a corresponding one of said apertures and affixed in thermally conductive contact with said elongate thermally conductive member.

[18. A light source in accordance with claim 2, wherein: a thermal transfer media disposed therein.]

19. A light source in accordance with claim [18] *2*, wherein: said elongate thermally conductive member comprises a flow channel for said [thermal transfer media] *fluid*.

20. A light source in accordance with claim 2, *further* comprising: at least one clip for mounting said elongate thermally conductive member in a fixture.

21. A light source in accordance with claim 2, *further* comprising: an electrically insulating layer disposed on said elongate thermally conductive member outer surface and carrying said electrical conductors thereon.

22. A light source in accordance with claim 21, wherein: said electrically insulating layer comprises a plurality of apertures, each aperture receiving one of said light emitting diodes; and each light emitting diode of said plurality of light emitting diodes being mounted in a corresponding one of said apertures [and in thermally conductive contact with said elongate thermally conductive member].

23. A light source in accordance with claim 22, wherein: each of said *plurality of* light emitting diodes emits white light.

*24. A light source in accordance with claim 2, wherein a longitudinal axis of each of said plurality of exterior fins is substantially aligned with a longitudinal axis of said elongate thermally conductive member.*

*25. A light source in accordance with claim 2, wherein the elongate thermally conductive member defines an interior cavity, and wherein the elongate thermally conductive member further comprises a plurality of interior fins extending into the interior cavity.*

*26. The light source in accordance with claim 25, wherein the plurality of interior fins comprises integral fins.*

*27. A light source in accordance with claim 25, wherein each of said plurality of interior fins has a longitudinal axis substantially aligned with a longitudinal axis of said elongate thermally conductive member.*

*28. A light source in accordance with claim 2, wherein said elongate thermally conductive member further comprises one or more apertures between the first end and the second end enhancing fluid flow through said elongate thermally conductive member.*

*29. A light source in accordance with claim 2, wherein said plurality of light emitting diodes further comprises a first plurality of light emitting diodes disposed in a third plane not coextensive with said first plane or said second plane.*

*30. A light source in accordance with claim 2, wherein said plurality of light emitting diodes are evenly distributed along a length of said elongate thermally conductive member for efficient heat dissipation.*

*31. A light source in accordance with claim 15, wherein said back of each of said plurality of light emitting diodes*

*maintains said thermal contact with said elongate member outer surface through said flexible circuit.*

*32. A light source in accordance with claim 2, wherein said back of each of said plurality of light emitting diodes maintains said thermal contact with said elongate member outer surface through a printed circuit.*

*33. A light source in accordance with claim 2, wherein said plurality of light emitting diodes are mounted in orientations spanning a range of 180 degrees to 360 degrees.*

*34. A light source in accordance with claim 1, wherein each of said plurality of exterior fins has a longitudinal axis substantially aligned with a longitudinal axis of said elongate thermally conductive member.*

*35. A light source in accordance with claim 1, wherein the elongate thermally conductive member defines an interior cavity, and wherein the elongate thermally conductive member further comprises a plurality of interior fins extending into the interior cavity.*

*36. The light source in accordance with claim 35, wherein the plurality of interior fins comprises integral fins.*

*37. A light source in accordance with claim 35, wherein each of said plurality of interior fins has a longitudinal axis substantially aligned with a longitudinal axis said elongate thermally conductive member.*

*38. A light source in accordance with claim 1, wherein: said elongate thermally conductive member comprises a flow channel for said fluid.*

*39. A light source in accordance with claim 1, wherein said elongate thermally conductive member further comprises one or more apertures between the first end and the second end enhancing fluid flow through said elongate thermally conductive member.*

*40. A light source in accordance with claim 1, wherein: each of said plurality of light emitting diodes emits white light.*

*41. A light source in accordance with claim 1, wherein said plurality of light emitting diodes comprise a plurality of light emitting diodes disposed in a single plane.*

*42. A light source in accordance with claim 1, wherein said plurality of light emitting diodes are mounted in orientations spanning a range of 180 degrees to 360 degrees.*

*43. A light source in accordance with claim 1, wherein said plurality of light emitting diodes are evenly distributed along a length of said elongate thermally conductive member for efficient heat dissipation.*

*44. A light source in accordance with claim 1, wherein a cross-section of said elongate thermally conductive member comprises flat portions.*

*45. A light source in accordance with claim 1, wherein said back of each of said plurality of light emitting diodes maintains said thermally conductive contact with said elongate member outer surface through a printed circuit.*

*46. A light source in accordance with claim 1, further comprising: an electrically insulating layer disposed on said elongate thermally conductive member outer surface and carrying said electrical conductors thereon.*

*47. A light source in accordance with claim 1, wherein said plurality of light emitting diodes emits colored light.*

*48. A light source in accordance with claim 47, wherein said light source produces white light.*

*49. A light source in accordance with claim 1, wherein said light source is configured for general illumination.*

*50. A light source in accordance with claim 1, wherein said elongate thermally conductive member is a single integral piece.*

*51. A light source in accordance with claim 2, wherein said plurality of light emitting diodes emits colored light.*

*52. A light source in accordance with claim 51, wherein said light source produces white light.*

*53. A light source in accordance with claim 2, wherein said elongate thermally conductive member is a single integral piece.*

* * * * *